United States Patent [19]
McKay

[11] Patent Number: 5,225,157
[45] Date of Patent: Jul. 6, 1993

[54] AMALGAM COMPOSITION FOR ROOM TEMPERATURE BONDING

[75] Inventor: Colin A. McKay, Austin, Tex.

[73] Assignee: Microelectronics and Computer Technology Corporation, Austin, Tex.

[21] Appl. No.: 701,543

[22] Filed: May 16, 1991

Related U.S. Application Data

[63] Continuation-in-part of Ser. No. 382,829, Jul. 19, 1989, Pat. No. 5,053,195.

[51] Int. Cl.$^5$ .............................................. C22C 28/00
[52] U.S. Cl. ................................... 420/525; 420/489; 420/555
[58] Field of Search ........................ 420/525, 555, 489

[56] References Cited

U.S. PATENT DOCUMENTS

| | | | |
|---|---|---|---|
| 3,141,238 | 7/1964 | Hartman et al. | 420/489 |
| 4,182,748 | 1/1980 | Anderson | 420/489 |
| 4,493,736 | 1/1985 | Adams | 420/489 |
| 4,603,090 | 7/1986 | Mizuhara | 420/489 |
| 5,024,264 | 6/1991 | Natori et al. | 420/555 |
| 5,053,195 | 10/1991 | MacKay | 420/555 |

OTHER PUBLICATIONS

"Amalgams as Alternative Bonding Materials," Proceedings of the Ninth Annual International Electronics Packaging Conference, San Diego, California, Sep. 11-13, 1989, vol. 2, p. 1244.

*Primary Examiner*—Upendra Roy
*Attorney, Agent, or Firm*—Fulbright & Jaworski

[57] ABSTRACT

An amalgam and a method of preparing an amalgam for bonding two articles together, which includes mixing a composition of a liquid metal and a metal powder to thoroughly wet the metal powder with the liquid metal, and thereafter mixing a composition with a pestle element for mechanically amalgamating the composition. Other additives may be provided such as ductile metals, additives containing oxides, ceramics, or other non-metallic compounds, and volatile constituents. The amalgamated composition can then wet surfaces to be bonded and harden at or near room temperature.

16 Claims, 3 Drawing Sheets

AMALGAM COMPOSITION FOR ROOM TEMPERATURE BONDING

This application is a continuation-in-part of copending U.S. application Ser. No. 382,829, filed Jul. 19, 1989, issued as U.S. Pat. No. 5,053,195 on Jun. 18, 1991.

BACKGROUND OF THE INVENTION

The present invention is directed to a bonding amalgam and method of making for bonding two articles together particular for providing a novel class of metals for bonding in electronic packaging and interconnect applications.

Bonding is probably the most neglected stage in the manufacturing sequence of electronic and microelectronic devices and assemblies. Most recent activity in the development of bonding materials has been directed toward polymer-based adhesives, which do not meet military standards. If metal alloys are required, then only traditional solders are available. Solders are unsatisfactory as they are subject to thermal cycle fatigue, require high bonding temperatures producing stress in the article being soldered, and have upper temperature limitations at their melting point It has been suggested in U.S. Pat. No. 3,141,238 that amalgams can be used for bonding in a manner analogous to their use in dentistry. An amalgam is a mechanically alloyed composition formed by a liquid metal and a metal powder. Amalgams in general have low processing temperatures, down to near room temperature, yet they yield materials with thermal stabilities between 250° and 600° C. depending upon the materials. However, the composition and formulation of the compositions of materials called amalgams in the prior art have not provided satisfactory bonding in electronic applications. Dental applications of amalgams rely upon a mechanical locking of the filler in the dental cavity because of a slight expansion of the amalgam. But in electronics, bonds involving adhesion and metallurgical interaction between surfaces are required and neither the dental amalgams nor the prior art materials can satisfactorily achieve this.

The present invention is also directed to a method of making a bonding amalgam that will achieve bonding of flat and co-axial geometries for application in electronic package bonding for die attach, hermetic sealing, heat sink attachment, innerlead bonding for tape automated bonding (TAB), and via filling of through holes in ceramic substrates.

SUMMARY

The present invention is directed to a method of preparing amalgams for bonding two articles together and includes mixing a composition together having a liquid metal or alloy sufficient to produce a fluid material that can readily be made to wet a joint surface, and a metal powder constituting the rest of the composition. The composition is mixed thoroughly to wet the metal powder with the liquid by a separate operation or by operation of a pestle element, and thereafter the composition is mixed with the pestle element which mechanically amalgamates the composition. That is, in some embodiments the pestle can both wet and hammer the powder. The amalgam produced is particularly advantageous for microelectronic bonding which frequently requires a joint between two flat surfaces. In order to provide a good bond, a metallurgical bond is required at the interfaces, which in turn requires wetting between the filler metal and the joint surfaces. In addition, after such wetting action the material is required to become hard, with a significant melting point, at or near room temperature. This wetting operation is the essential action which produces a material that will be fluid enough to allow wetting and the formation of a metallurgically sound joint. The hammering action of amalgamation initiates the reaction between the liquid and the powder metals which is the essential mechanism for producing a fluid material which will subsequently harden at or near room temperature.

Still a further object of the present invention is wherein the composition is mixed in an amalgamator at approximately 3600 cpm (cycles per minute) for a time sufficient to fully wet all the powder, typically 1 to 20 seconds, and thereafter at approximately 3000 cpm for a time sufficient to produce a fluid amalgamated mix in which every powder particle carries a thin film skin of reaction product of the liquid component and the powder component, a typical time being 3 to 5 seconds. These conditions are critically dependent upon the system of liquid metal or alloy and powders being used.

Yet a still further object of the present invention is wherein the metal powder includes ductile particles selected from a group consisting of aluminum, molybdenum and tungsten for providing a more ductile matrix in the cured amalgam.

Still a further object of the present invention is wherein the composition includes additives selected from a group of oxides, ceramics, alumina, diamond, graphite, nitrides, phosphides, and sulfides for providing enhancements such as a harder, more corrosion-resistant, surface active, and wear resistant amalgam.

A still further object of the present invention is wherein a volatile constituent, such as zinc or mercury, is included within the liquid metal so that while allowing amalgamation there will be an ample amount of fluid to facilitate surface wetting of the surfaces of a joint. During cure the amount of fluid can be reduced so that when fully cured the amount of reaction product, which is dictated by the amount of fluid, can be reduced and the proportion of elemental powder metal, which effects joint ductility, can be controlled.

A still further object of the present invention is wherein the liquid metal is gallium and the metal powder includes nickel and copper. In one embodiment, the composition includes approximately 65% gallium, 30% copper, and 5% nickel by weight.

Other and further objects, features and advantages will be apparent from the following description of presently preferred embodiments of the invention, given for the purpose of disclosure.

DESCRIPTION OF THE PREFERRED EMBODIMENTS

Figure 1:
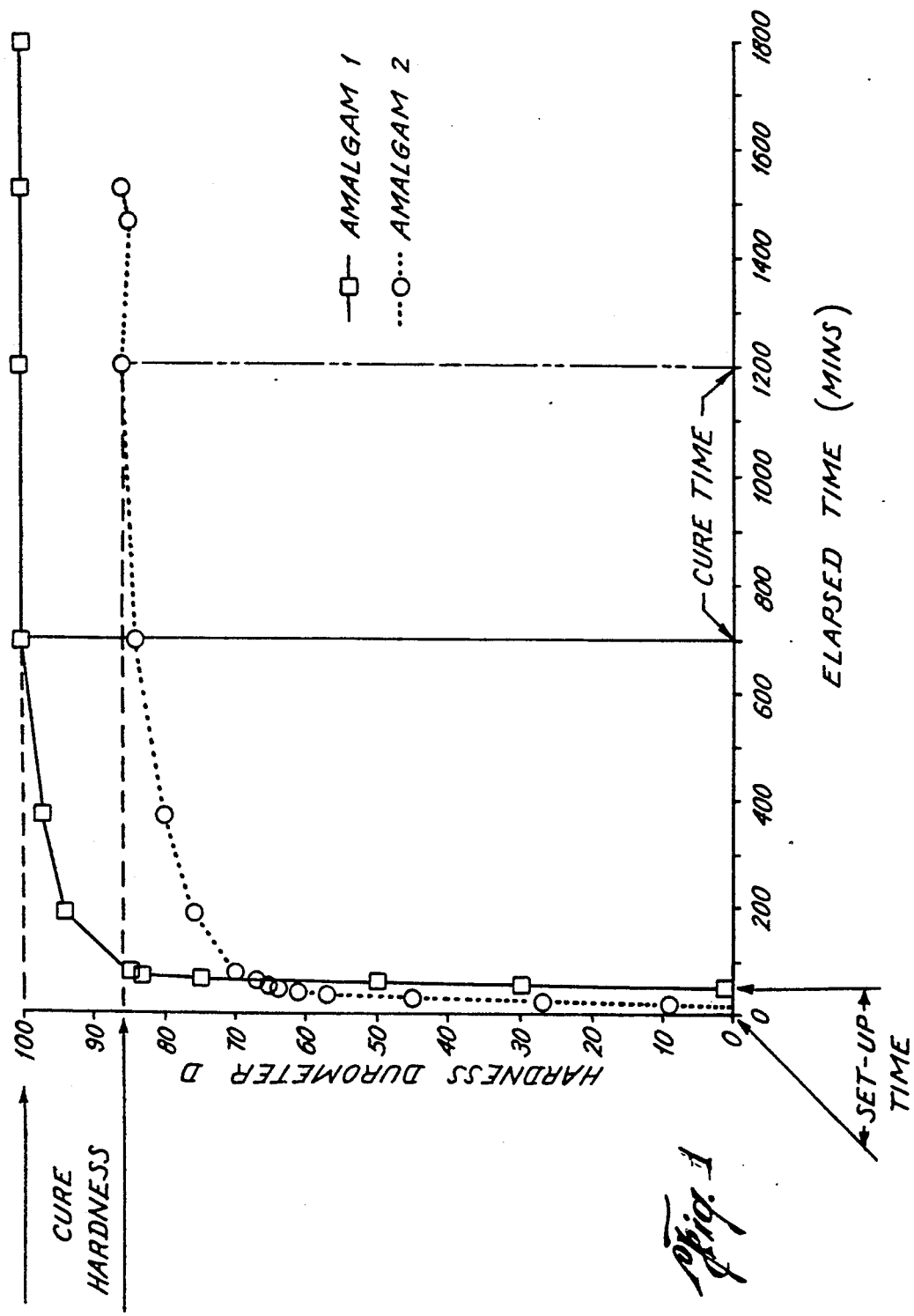
FIGS. 1-5 are amalgam hardening curves illustrating set-up time, cure time and cure hardness for various amalgamation processes.

An amalgam is defined as a non-equilibrium, mechanically alloyed material formed between a liquid metal and a powder. Combinations of the following are some of the possible compositions:

TABLE 1

| Liquids (Melting Point. °C.) | Powders |
| --- | --- |
| Gallium (30) | Antimony |
| Indium (259) | Cobalt |
| Gallium/Tin (16) | Copper |
| Gallium/Indium (15) | Chromium |
| Gallium/Indium/Tin (5) | Germanium |
| Other Combinations with | Gold |
| Mercury, Cadmium, and | Iron |
| Bismuth | Nickel |
|  | Magnesium |
|  | Manganese |
|  | Platinum |
|  | Silver |
|  | Vanadium |

Amalgams harden or cure by reaction of the liquid with the powder to form intermetallic compounds between the powder particle cores. This reaction product is initiated around each powder particle by the hammering action of a pestle element during the amalgamation process. The pestle element can be any material or object which can be used to hammer the composition during the amalgamation process. For example, in a commercial amalgamator it is a steel roller bearing. Use of certain of the above liquids and powders has been suggested in the prior art. However, the composition ranges and mixing conditions which were used do not produce materials capable of satisfactorily bonding flat or co-axial geometries, particularly for microelectronic bonding where there is a need to make a joint between two surfaces. Applicant has found that to produce the required metallurgical bond at the interfaces of such surfaces requires good wetting between the filler metal and the joint surfaces. Applicant has also found that for good bonding, the material must be more fluid than that described in the prior art. Applicant has determined optimum composition ranges and amalgamation conditions to achieve the wetting to make a strong joint.

A commercial dental amalgamator, for example a Caulk "VARI MIX" (trademark) II, was used to make Ga-Cu, Ga-Ni, Ga-Ag and Ga-Ni-Cu amalgams. A matrix experiment has been completed using Ga as the test system, to determine the significance and interrelation of the main amalgamation parameters of amalgamation time, amalgamation frequency, composition, gallium temperature and charge size. From this, the parameter settings were found that were necessary to make fluid mixes that remained liquid for up to 4 hours (to give long work life) and yet would set hard in 1.5 hours at 100° C. The hardening, however, could also occur at room temperature if desired, in which case the hardening time would be increased. These amalgams readily wetted alumina, silicon, beryllia, GaAs, copper, stainless steel, molybdenum and tungsten without metallization. Lap joints between electro-deposited copper foil gave maximum shear strengths of 750 grams for a 3/16 inch squared joint. Simulated die shear tests using a ¼ in. x 3/16 inch alumina die on alumina gave shear values up to 102 Kg. (in excess of 7000 PSI). Thermal expansion for this material ranges from 4.8 ppm (15°-25° C.) to 39.8 ppm (145°-155° C.), although there were differences dependant upon composition and cure history. Thermal conductivity was typically 46 W/m degree K. Electrical resistivity was typically 28 to 32 micro-ohm-cm.

It is to be noted that in order to obtain the necessary wetting and joint strength in the test system, the composition included a mixture of liquid metal which forms at least 50 wt. % of the composition and a metal powder comprising less than 50 wt. % of the composition. In the preferred embodiment the liquid metal is greater than 60 wt. %. Such a composition was able to wet a surface for making the necessary bond as well as providing sufficient liquid to wet and interact with the powdered particles. Prior art compositions provided a texture which was stiff to almost a powdery consistency and which would not wet and provide continuous filling in void free joints. In addition, the prior art method of mixture generally used a hand-mixing pestle which then required placing joints together under pressure and relying upon temperature to make the reaction between the liquid metal and the metal powders. Applicant, on the other hand, mixes the composition with a pestle element for mechanically amalgamating the composition to mechanically interact the liquid metal and the powdered metal to produce the alloying without requiring bonding pressure between the articles to be bonded and without requiring increased temperatures for curing. The composition is mixed to thoroughly wet the metal powder with liquid metal so that a uniform coating of liquid metal is formed over essentially every metal powder particle. For example, using the above-described dental amalgamator, the compositions were mixed at approximately 3600 cpm for approximately one to twenty seconds which caused a mixing or wetting action of the composition. During this procedure, the steel ball or vibrating hammer in the amalgamator was impeded from hitting against the sides so long as it was encountering non-wetting powder. However, at the conclusion of the wetting process, the pestle would strike the sides of the amalgamator and could be heard to do so. Thereafter the frequency of operation was reduced to 3000 cpm for a period of approximately three to five seconds, which was sufficient to initiate the chemical action between the liquid and the powder yet still provide material of sufficient fluidity to wet flat or co-axial geometric surfaces when applied along with a pressure and abrasion, and which would remain in this condition from 240 to 360 minutes at 30° C. There are two processes involved in amalgamation. The first involves wetting of the powder by the liquid component. The second is a mechanical alloying during which a very thin rim of reaction product composed of liquid metal and powder elements is produced around each powder particle.

Important parameters to evaluate the efficiency and efficacy of amalgamation are the set-up time and the cure time. It is known that the shorter the mechanical alloying time after the powder component has been wetted the longer the set-up time and the cure time. Mixing with an amalgamator requires a certain minimum amount of time to wet all the particles of the powder component. This time is dependent upon the vibration frequency, the composition, the charge size and the surface condition of the powder. Typically the wetting times at a frequency of 3600 cpm are about 5 to 10 seconds. Increasing the frequency to 4000 cpm can reduce the wetting time to 3 seconds. This time, however, is dependent upon powder age and surface condition.

Another element of the time is the mechanical alloying time. When the mechanical alloying frequency of vibration is approximately 3000 cpm, about 3 to 5 seconds are needed to obtain a uniform mechanical alloying. Typically wetting at 3600 cpm for 5 10 seconds (dependant upon powder surface condition) followed by a mechanical alloying at 3000 cpm for 3 to 5 seconds produces an amalgam which requires at least 120 minutes set-up time. Thus, there is at least 2 hours to manipulate and align the components on a chip.

Increasing the vibration frequency leads to shortening the set-up time. This can be a disadvantage, because it can produce an amalgam which sets up in the capsule. On the other hand, if the frequency is too low there is the risk that there will be no mixing or that the mixing will be non-uniform and thus a poor amalgam will form.

The charge size also contributes to the amalgamation time. The charge is the amount of liquid metal plus metal powder which is added to a capsule in an amalgamator for amalgamation. The larger the charge size for any given capsule, the longer the amalgamation time will be in order to produce a useful material. Ultimately the charge size will be so large that there will be insufficient room for movement of the pestle within the capsule and thus amalgamation cannot take place. In a capsule of approximately 1.5 ml volume a convenient charge size is approximately 3 grams total of metal powder and liquid metal. On the other hand, if the charge is too small for the size of the capsule it becomes very difficult to identify when mixing has finished and thus correspondingly difficult to know the appropriate amalgamation time.

Control of temperature is another necessary element to achieve a final reliable product. Optimally the lowest possible temperature which is consistent with the liquidity of the liquid element should be used. For example, Ga has a melting point of 29.6° C. Because of the tendency of Ga to supercool, it is possible to get amalgamation at room temperature, approximately 25.C. Once amalgamation has started the heat generated by the friction between the pestle and the powder will maintain the process. Unfortunately, supercooling is not a reliable phenomenon. Thus, in the preferred embodiment, the amalgamation was usually performed at about 35° C. as the minimum temperature when using Ga. One skilled in the art would readily recognize that the temperatures must be adjusted for whatever liquid material or combination of liquid material is being used. Appropriate tables are available for this purpose.

Cu-Ga amalgamation conditions did not translate from the Ni-Ga system. Powder particle size and age were far more critical. Joint strengths up to 700 grams were obtained with copper foil lap joints and die shear test values up to 25 Kg were obtained. This system did not wet so readily and the spread of results reflects this. Thermal cycle performance with this system was good, giving 0% failures out to 2500 cycles from −65 to +150.C for copper/copper and copper coated alumina samples. Hardening times in this system, however, were very extended (72 hours to 96 hours).

Trials with a Ni-Cu-Ga ternary indicate that properties may be additive in that thermal cycle results in excess of 1200 cycles from −65° to +150° C. were achieved strength values near those for the nickel system at hardening times intermediate between the two. Also, the same good wetting characteristics as for nickel were maintained.

In some tests, it was observed that the tendency for the copper compound in the Ga-Cu system is to form large orthorhombic crystals which produce marked shrinkage in the meniscus. This greatly increases the chances of voids and gross leakage in this bond. In the Ga-Ni-Cu system, solidification is with finer grains, and this does not happen.

Die attach samples with shear strengths between 7X and 18X, the maximum required by MIL-SPEC-883C, have been made. Wetting, without metallization, to a broad variety of materials has been demonstrated and bond-strengths which satisfy military requirements. Satisfactory thermal cycle performance for military requirements has been demonstrated.

The gallium-based liquids which were investigated showed an ability to wet a large range of oxides, ceramics and semiconductor materials directly, which offers opportunities to use fewer or no extra metallization layers. Implicit in this, for example, would be the possibility of using plain, unpolished ceramics for hermetic seal lids with the amalgam both wetting the ceramic directly and also compensating for the flatness irregularities which is the main problem with ceramic lids at present.

Another possibly desirable use is the inclusion of ductile particles (powder cores) in a matrix of more brittle compounds to give the best mechanical and thermo-mechanical properties. That is, some elements that while wetted with gallium do not react with it could provide ductile characteristics. Examples are aluminum, molybdenum, and tungsten.

Other possible additives to the amalgam composition are oxide and ceramic or other non metal additives such as alumina, diamond, graphite, nitrides, phosphides, and sulfides. Such additives can provide, for instance, a hardened and more corrosion-resistant bond, increased wear resistance, as well as a surface active property which specifically attracts certain undesirable materials such as carbon monoxide, oil, or curing agents in plastics.

A specific embodiment in the present invention uses indium (In) and tin (Sn) in a preallyed state in order to provide these elements in a "liquid" form at a low temperature. As used herein these elements are always present as liquid metal components. It is important to have In or Sn as a liquid metal, because this provides for a high atomic mobility of the atoms. With increased mobility, reactions such as wetting and mechanical alloying proceed at far higher rates. Furthermore, when In or Sn are present as liquids none of the amalgamation time is required to mix these components. The liquids by their very nature are a finely mixed assemblage of the respective elements. Thus, liquid In or Sn mix with the powder components much more effectively. Because of the more rapid and effective mixing, the amalgamation time is kept to a minimum and the lifetime in the fluid state is correspondingly extended. The extended lifetime increases the working time before the material becomes too stiff. Recognition and use of this important step is a distinct improvement over the prior art.

It is known that liquid amalgam does not spontaneously wet a surface at room temperature. Thus, if a powder is simply dipped into a wet powder, the surface will not have a coating of amalgam adhering to it when it is withdrawn. Some form of mechanical scrubbing is necessary. This mechanical scrubbing can be supplied in a variety of ways including spreading action, polishing motion, pressure or ultrasonic energy. In the present preferred embodiment amalgam is applied to the surface under the following conditions:

1. Manual spreading with a spatula
2. By polishing the surface with an amalgam coated, lapped copper buff.
3. By ultrasonically dispensing with a ceramic capillary.

4. By brushing with a steel bristle brush.
5. By ceramic roller.

Once an amalgam has been applied to the components and the can be cured at room components have been aligned, an assembly temperature or by placing in an oven. The temperature of the oven is chosen to balance the maximum temperature that the components can sustain and achieve the desired shortest interval necessary to cure.

Methods of preparing the surface of ceramic or polymer based substrates so that a solder connection can be made to them, are lengthy and expensive. The present invention provides a quick and inexpensive method to solve this problem.

The amalgam can be applied directly onto the surface of the ceramic or polymer as a thin spread layer or in a "Hershey Kiss" profile. After full cure the metal can function as a connection pad.

Experiments with Ga-Ni-Cu samples have shown that electrically conductive connections can be made. The solder wets the cured amalgam with a contact angle at about 60 degrees. A disadvantage of this method is the necessity to wash the assembly to remove flux residues.

An alternative method employs a small preform of solderable metal foil such as copper or nickel. The preform is bonded onto the substrate using the amalgam as the bonding material. After bonding, the preform can be readily soldered with the low activity fluxes used for electronics soldering.

It is important that the amalgam has sufficient working time. In a multi-chip module several components must be assembled and must be functional to achieve an economically and technically sufficient product. It takes time to align and test these components and to tune and obtain optimum performance. Only after the fully functional and optimum performance modules are ready should the amalgam cure. Thus, amalgams with a set-up time of at least 120 minutes are needed to provide prolonged fluid lifetime for the adjustments.

Ga amalgamations were used to show the effects of size, composition, time and vibration frequency on amalgamation. In these examples, mechanical alloying was done using Ga as the liquid metal in a commercial dental amalgamator (Caulk Varimix II) with a Bakelite capsule. Mechanical energy was transmitted by rapid oscillation of the capsule which contained a stainless steel roller bearing as the pestle element. As can be seen in FIGS. 1-5, the following elements effect the alloy: (1) the temperature at amalgamation; (2) the size of the charge in the amalgamation capsule; (3) the composition of the mixture; (4) the frequency at which the capsule is vibrated; and (5) the amalgamation time. The amalgamation time is not simply the time setting available on a commercial amalgamator, but rather is the length of time for which the mixture was mechanically alloyed after the powder component had been fully wetted. This difference can be observed by separating the steps of wetting from mechanical alloying. Amalgamation time and vibration frequency were shown to have the greatest effects in the ability to produce fluid amalgams useful for joint making.

For the purposes of definition, certain points within the dynamic range of material conditions that an amalgam passes through are shown in FIG. 1. In FIG. 1, the typical passage of amalgam from a liquid to a solid is shown. In this way "Set-up time" was defined as the time needed for the amalgam to stiffen to a durometer D scale hardness of 15. "Cure time" is the time needed to reach ultimate hardness, a D of at least 92 (approximately 200 Knoop hardness).

The closest grouping of set-up times for replicate experiments was achieved when the powder component was first wetted by hand mixing and then amalgamated for 5 seconds at 3000 cpm. The reproductivity of set-up times in these conditions was +/−2.8 minutes. When the commercial amalgamator is set for 3–20 seconds at 3,600 cpm and then at 3,000 cpm for 3 seconds, the variation became +/−7.6 minutes. When the amalgamator was set for a single time and vibration, the standard deviation was +/−18.6 minutes.

Examination of FIGS. 1-5 also shows that the cure time values have a wide range in comparison with set-up times, but tend to fall in the same trends. For example, hand mixing took an average of 12 hours for the samples to set at 35° C. and the variation between the samples was +/−4.5 hours, while using a single overall setting required approximately 32 hours to cure with variations of +/−28 hours.

Within the duration of "amalgamation time", there are two distinct parts to the amalgamation process. In the first part there was no audible sound. This was followed by a period in which the pestle could be heard "clacking" against the ends of the capsule. Those samples which showed the most divergent properties were those for which there was a large difference in the onset of audible signal. If the vibration of the capsule was stopped before any audible sound, then either no wetting or incomplete wetting of the powder fraction of the mix was observed. When it was stopped once the pestle sound was heard, the powder was mixed and wetted.

Figure 2:
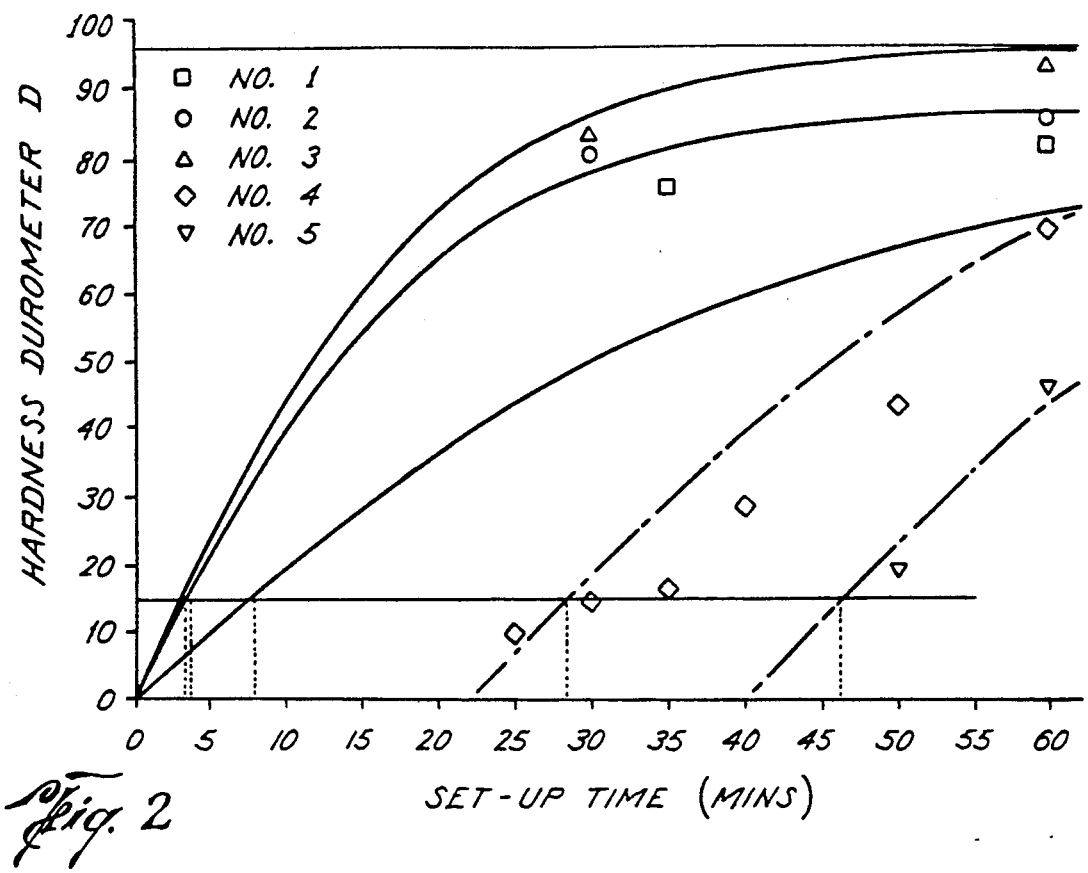

Those samples in which the audible sound was heard early in the amalgamator time cycle tended to cluster in a close group of both set-up and cure times. Samples with longer amalgamation times, 20 to 30 seconds, tended to have the most divergent set-up and cure times. FIG. 2 illustrates typical variations in the results for set-up times of 5 replicate experiments with 30 wt. % Ni/Ga amalgams. The conditions were a Ga temperature of approximately 60° C., amalgamation times of 30 seconds amalgamation frequency at 3600 cpm and a charge size of 2 grams. In this case, the mean set-up time was 17.7 minutes with standard deviation at 18.6 minutes. Cure times of the same set of replicates had a mean value of 1911 minutes and the standard deviation was 1680 minutes.

Figure 3:
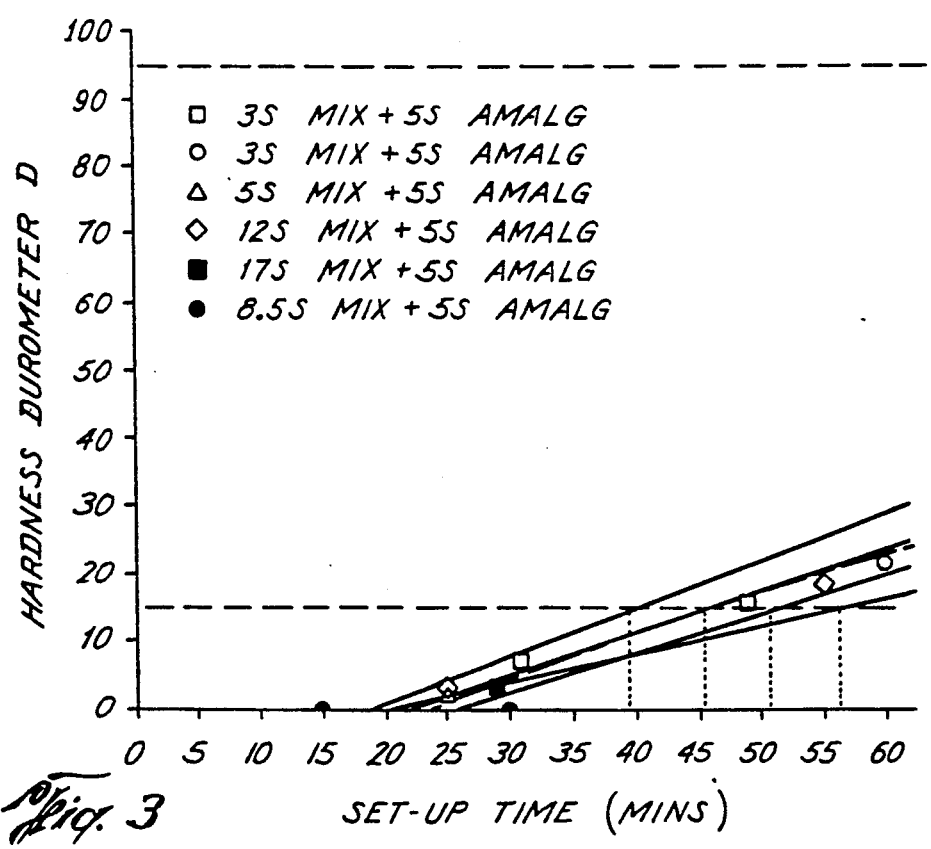

In comparison, when the amalgamator was used to mix the Ga with the powder until the onset of noise in the capsule, and then the amalgamation time was set for 5 seconds the set-up time results shown in FIG. 3 were obtained. In this instance, the mean set-up time was 49.5 minutes with standard deviation of only 7.6 minutes.

The two stages in the amalgamation process were not completely separated by the process. The two processes were intermixed during machine mixing and amalgamating. Some parts of the powder charge would wet quickly and would be available for mechanical alloying before other parts were wetted, so that the assumption of a discrete mixing time and a discrete amalgamating time was not completely true.

Figure 4:
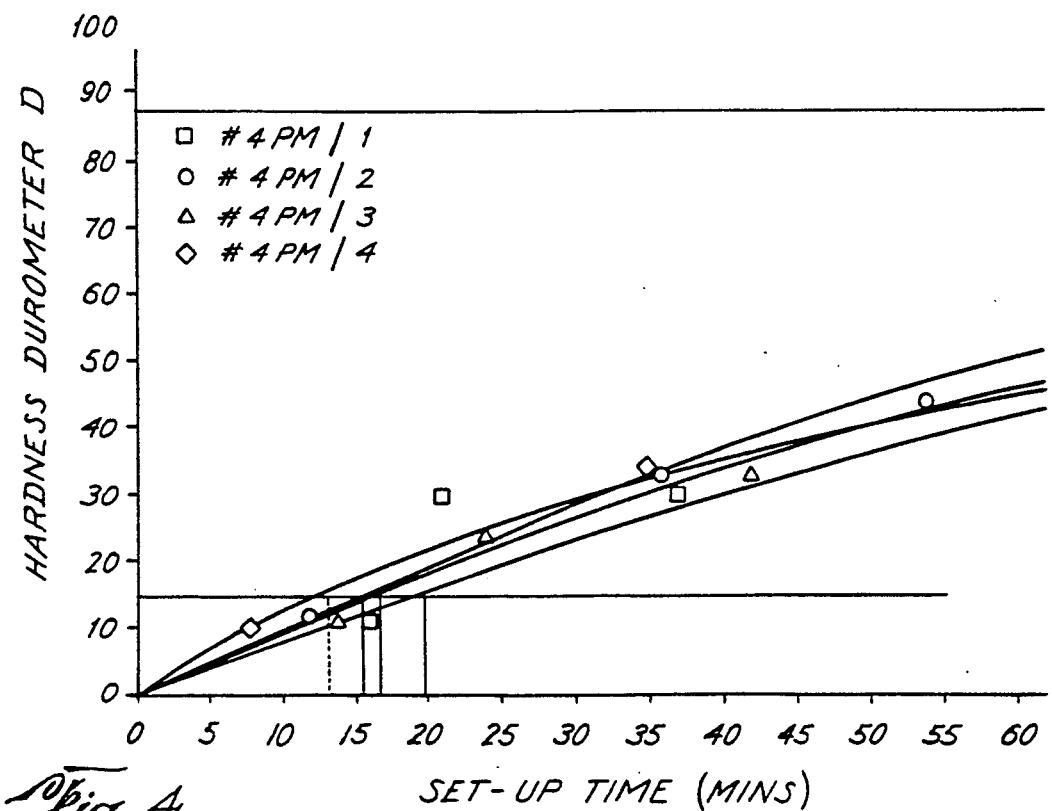
Figure 5:
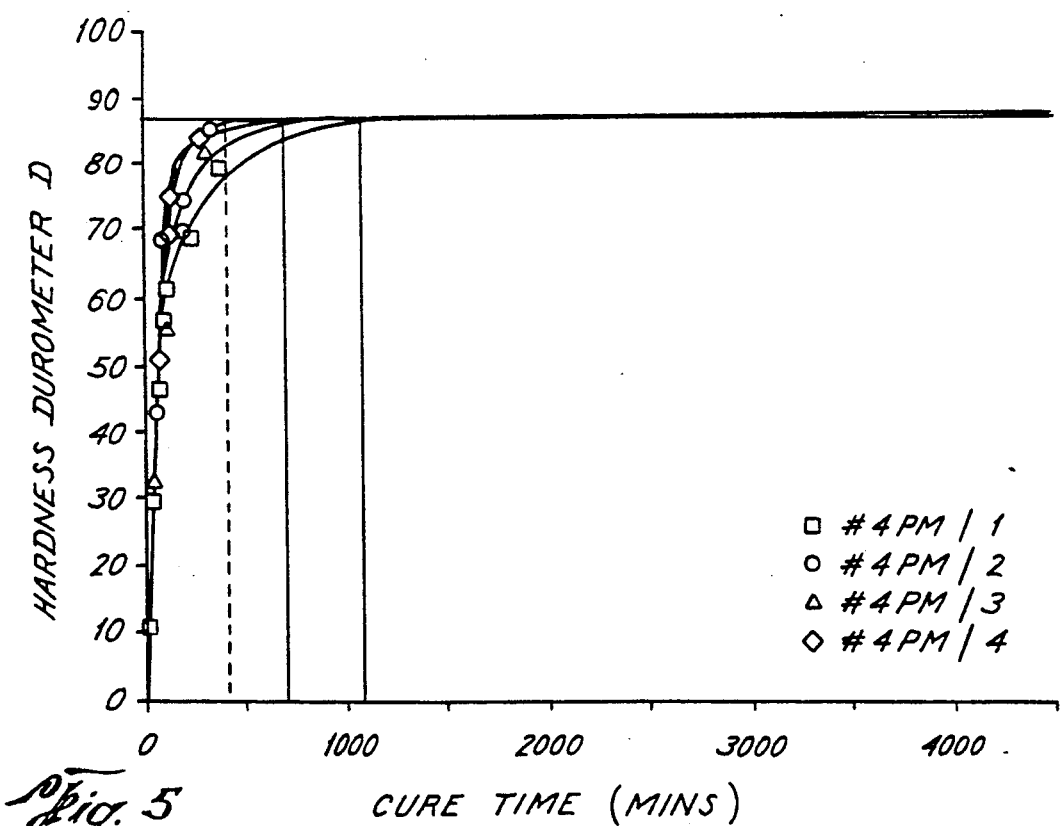

In order to estimate the effects of these differences 16, grams of powder was hand mixed in a petri-dish with the appropriate amount of Ga to give a 30 wt. % Ni/Ga mix. Samples of the wetted powder which had not been subjected to any mechanical alloying, were then amalgamated for 5 seconds in the amalgamator. Set-up times as shown in FIG. 4 were much closer with a mean value of 16.4 minutes and standard deviation of 2.8 minutes. As seen in FIG. 5, cure times were also a closer group, having a mean of 722 minutes with a standard deviation of 272 minutes.

Thus, the original selection of the time for which the capsule was vibrated as a single discrete parameter "amalgamation time" is not accurate. This parameter was in fact two variables, namely a "mixing time" plus a "amalgamation time." Thus, preparation of an amalgam involves: (1) first wetting the powder part of the mix by disrupting the oxide skin of each powder particle when it is immersed in the liquid portion; and (2) mechanically alloying the liquid portion with the solid powder surface under the action of the continued hammering by the pestle, to initiate a skin of reaction product about each powder particle. Following the two step procedure achieves amalgams that set-up at room temperature at far lower powder percent compositions than reported in the prior art.

EXAMPLE 1

Using matrix experimental methods the relative magnitudes of the effects of each amalgamation variable were examined. In the Ni-Ga system:
1. Each 1 wt. % Ni increase in composition, decreases set-up time by 16 minutes while decreasing cure time by only 1 hour;
2. Each second of amalgamation time decreases set-up time about 17 minutes and cure time by 12 hours; and
3. Changing the amalgamation frequency from 3000 cpm to 3600 cpm, decreases set-up time by 32 minutes and cure time by 17 hours.

Using the effects coefficient to determine a response surface from which a constitutive equation can be derived showed the equations for Set-Up Time and Cure Time respectively to be of the forms:

Set-Up Time = Constant + A*Composition + B*Gallium Temperature + C*(Amalgamation time) + D*(Amalgamation Frequency) + E*(Composition)*(Gallium Temperature) + F*(composition *(Amalgamation Frequency) + G*(Gallium Temperature)*(Charge Size) + H*(Amalgamation Time)*(Charge Size) + I*(Amalgamation Time)*(Powder Preparation Time) + J*(Amalgamation time)$^2$ where Constant = 71.35 A* = −58.94 B* = −18.41 C* = −46.44 D* = 55.52 E* = 11.31 F* = 41.68 G* = 14.40 H* = 21.81 I* = −28.50 J* = −9.78.

Cure Time = Constant + A(Composition) + B(Amalgamation Frequency) + C(Amalgamation Frequency) + D(Composition)(Gallium Temperature) + E(Charge Size)(Composition) + F(Gallium Temperature)(Charge Size) + G(Gallium Temperature)(Amalgamation Time) + H(Amalgamation Time)(Amalgamation Frequency).

Constant = 47.48; A = −8.90; B = −25.32; C = −15.42; D = 10.17; E = −8.65; F = −9.92; G = −16.16 and H = 13.61. three compositions recommended in U.S. Pat. No. 3,141,238, and three compositions by the present inventor found to be usable for bonding. The compositions were then formulated according both to the '238 patent and to the present method of formulation. The '238 formulation consists of where the components of the material are blended together in a hand mixing operation designed to simply wet the powder particles by the liquid metal. The present method of formulation involves the use of a commercial dental amalgamator machine in which the materials are constrained in a capsule together with a steel pestle shaped like a roller bearing and mechanically agitated by vibrations at frequencies of 3600 and 3000 cycles per minute as described above. However, during this action, the roller bearing vigorously hammers the powder fraction in the presence of the liquid metal. This hammering action initiates the reaction between the liquid and powder metals which is an essential mechanism for producing a fluid material that allows formation of a metallurgically bonded joint and which will subsequently harden at or near room temperature.

The results of "Fluid" indicates whether the formulated composition is fluid, "Wet Surface" indicates whether the surface of the bonded joints produces a fluid wet surface, and the term "Makes Joint" indicates whether a void-free overlap joint resulted.

EXAMPLE 2

Using the '238 compositions and method of formulation, the results are as follows:

| Composition | Fluid | Wets Surf. | Makes Joint | Set-Up Time min. (35° C.) | Cures Time min. (100° C.) |
|---|---|---|---|---|---|
| 66% Cu—Ga | NO | NO | NO | 20 | 25 |
| 65% Ni—Ga | NO | NO | NO | 35 | 100 |
| 44% Cu 24% Sn—Ga | NO | ? | NO | 350 | 200 |

EXAMPLE 3

Using the '238 compositions but using the formulation of the present invention, the results are as follows:

| Composition | Fluid | Wets Surf. | Makes Joint | Set-Up Time min. (35° C.) | Cures Time min. (100° C.) |
|---|---|---|---|---|---|
| 66% Cu—Ga | NO | NO | NO | 20 | 25 |
| 65% Ni—Ga | NO | NO | NO | Hard in Capsule | |
| 44% Cu 24% Sn—Ga | NO | NO | NO | 40 | 65 |

EXAMPLE 4

This example used the compositions of the present invention, but formulated them in accordance with the teaching of the '238 patent with the following results:

| Composition | Fluid | Wets Surf. | Makes Joint | Set-Up Time min. (35° C.) | Cures Time min. (100° C.) |
|---|---|---|---|---|---|
| 35% Cu—Ga | Y | Y | Y | NO | NO |
| 30% Ni—Ga | Y | Y | Y | NO | 4500 |
| 5% Ni 30% Cu—Ga | Y | Y | Y | 4500 | 4000 |

EXAMPLE 5

Using the compositions of the present invention along with the formulation of the composition by the present invention, the results are as follows:

| Composition | Fluid | Wets Surf. | Makes Joint | Set-Up Time min. (35° C.) | Cures Time min. (100° C.) |
|---|---|---|---|---|---|
| 35% Cu—Ga | Y | Y | Y | 1000 | 1500 |
| 30% Ni—Ga | Y | Y | Y | 400 | 45 |
| 5% Ni 30% Cu—Ga | Y | Y | Y | 700 | 90 |

The above results show that for the composition materials and method of formulation as disclosed in the '238 patent Example 2, the texture is a stiff almost powdery consistency, the compositions cannot be made to wet a surface, and will not make overlap type joints. Even with considerable scrubbing, there is little evidence of any liquid phase on the surface of a joint member.

Using the composition materials of the '238 patent, and formulating them according to the present invention, Example 3, the composition is equally or more stiff and performs as poorly from the joint-making viewpoint.

Example 5, using the composition of the present invention and formulated by the present invention, produces fluids which readily wet flat surfaces and make continuous, void-free overlap joints. The joints remain liquid at 35° C. for between one and four hours and then harden, becoming firm (reach 100 durometer) in about twelve to fifteen hours after the onset of solidification. The hardening may be accelerated by elevated temperatures so that they become firm after only thirty to fifty minutes at 100° C. and fully harden after only sixty to five hundred minutes.

However, using the present compositions, but formulated hardened at 35° C. At 100° C. they took about three hundred to five hundred minutes to become firm and only the 30% nickel composition achieved the ultimate final hardness.

The above experiments were carried out to twelve thousand minutes but only in Example 5, using the present compositions and methods of formulations, did the materials produce fluid, wet flat surfaces, and make void-free overlap joints. Trials have shown that mercury-based systems did not lend themselves to hardening acceleration by temperature. The high vapor pressure of mercury results in evaporation of the liquid, and the amalgam becomes a powder. Because of the toxicity of mercury vapor, mercury containing compositions would be used only if the process advantages outweigh the difficulties in the necessary safety precautions. Volatization of mercury could be used to advantage when it is alloyed with other elements in the liquid. Gallium, by comparison, has a boiling point of 1983.C so that at room temperature the partial pressure is then significant and the alloys are stable.

The present invention, therefore, is well adapted to carry out the objects and attain the ends and advantages mentioned as well as others inherent therein. While presently preferred embodiments of the invention have been given for the purpose of disclosure, numerous changes in the details of construction, arrangement of parts, compositions, elements used, and steps of the process, will be readily apparent to those skilled in the art and which are encompassed within the spirit of the invention and the scope of the appended claims.

What is claimed is:

1. An amalgam composition, comprising:
   a metal liquid;
   a metal powder;
   essentially all metal powder particles thoroughly wetted with liquid metal;
   sufficient metal liquid so that the amalgam wets surfaces to be bonded at room temperature under pressure or abrasion; and
   sufficient metal powder so that the amalgam sets up and hardens at or near room temperature.

2. The amalgam of claim 1 wherein the liquid metal is selected from the group consisting of gallium, indium, gallium/tin, gallium/indium, and gallium/indium/tin.

3. The amalgam of claim 1 wherein the metal powder is selected from the group consisting of antimony, cobalt, copper, chromium, germanium, gold, iron, nickel, magnesium, manganese, platinum, silver, and vanadium.

4. The amalgam of claim 1 wherein the metal powder includes ductile particles selected from the group consisting of aluminum, molybdenum, and tungsten for providing a more ductile amalgam, wherein said ductile particles in amalgam are in a concentration of about 2 to 20 wt. %.

5. The amalgam of claim 1 wherein the composition includes additives selected from the group consisting of ceramics, diamond, graphite, nitrides, phosphides, and sulfides.

6. The amalgam of claim 1 wherein the composition includes oxide as an additive, wherein said oxide in amalgam is in a concentration of about 2 to 10 wt. %.

7. The amalgam of claim 1 wherein the composition includes aluminum as an additive, wherein said aluminum in amalgam is in a concentration of about 5 to 20 wt. %.

8. The amalgam of claim 1 wherein the metal powder composition is between 25 to 50 wt. %.

9. The amalgam of claim 1 wherein nickel is the metal powder, gallium is the liquid metal and the nickel content is between about 30 to 45 wt. %.

10. The amalgam of claim 1 wherein copper is the metal powder, gallium is the liquid metal and the copper composition is between about 30 to 45 wt. %.

11. The amalgam of claim 1 wherein the metal powder is made up of a mixture of nickel and copper, gallium is the liquid metal and the content of the nickel is between about 5 and 15 wt. % and the content of the copper is between about 30 to 40 wt. %.

12. The amalgam of claim 1 wherein the liquid metal forms greater than 50 wt. % of the composition and the metal powder forms less 50 wt. % or less of the composition.

13. The amalgam of claim 1 wherein the liquid metal forms greater than 60 wt. % of the composition.

14. The amalgam of claim 1 wherein the composition further includes a volatile constituent and wherein the amount of evaporation of said volatile constituent controls the final proportion of the final reacted intermetallic compound in the amalgam.

15. The amalgam of claim 2 wherein the liquid metal further contains a material selected from the group consisting of mercury, cadmium, and bismuth.

16. The amalgam of claim 14 wherein the volatile constituent is selected from the group consisting of zinc and mercury, wherein said volatile constituent in amalgam is in a concentration of about 2 to 10 wt. %.

* * * * *

UNITED STATES PATENT AND TRADEMARK OFFICE
CERTIFICATE OF CORRECTION

PATENT NO. : 5,225,157
DATED : July 6, 1993
INVENTOR(S) : Colin A. Mackay

Page 1 of 3

It is certified that error appears in the above-indentified patent and that said Letters Patent is hereby corrected as shown below:

On the title page, Item [75]: the inventor's name should be --Colin A. MacKay not "Colin A. McKay".

Column 1, line 25, "point" should be --points.--

Column 3, line 41, "Ga" should be --Ga-Ni--.

Column 5, line 33, "25.C" should be --25°C--.

Column 5, line 52, "150.C" should be --150°C--.

Column 5, line 58, "achieved for silicon on alumina, with strength--

Column 7, line 4, "the can" should be --the components have been aligned, an assembly can--.

Column 7, lines 4-5, after "room" and before "temperature", "components have been aligned, an assembly" should be deleted.

UNITED STATES PATENT AND TRADEMARK OFFICE
CERTIFICATE OF CORRECTION

PATENT NO. : 5,225,157
DATED : July 6, 1993
INVENTOR(S) : Colin A. Mackay

It is certified that error appears in the above-indentified patent and that said Letters Patent is hereby corrected as shown below:

Column 8, line 38, "the-most" should be --the most--.

Column 9, line 58, before "three" insert --The following examples illustrate the test results testing--.

Column 10, line 29, "44% Cu" should be --44% Cu 24% Sn-Ga--.

Column 10, line 30, "24% Sn-Ga" should be deleted.

Column 10, line 45, "44% Cu" should be --44% Cu 24% Sn-Ga--.

Column 10, line 46, "24% Sn-Ga" should be deleted.

Column 10, line 61, "5% Ni" should be --5% Ni 30% Cu-Ga--.

Column 10, line 62, "30% Cu-Ga" should be deleted.

Column 11, line 8, "5% Ni" should be --5% Ni 30% Cu-Ga--.

Column 11, line 9, "30% Cu-Ga" should be deleted.

Column 11, lines 36-37, after "formulated" insert --according to the '238 method, Example 4, the materials never fully--.

UNITED STATES PATENT AND TRADEMARK OFFICE
CERTIFICATE OF CORRECTION

PATENT NO. : 5,225,157
DATED : July 6, 1993
INVENTOR(S) : Colin A. Mackay

It is certified that error appears in the above-indentified patent and that said Letters Patent is hereby corrected as shown below:

Column 11, line 55, "1983.C" should be --1983°C--.

Signed and Sealed this

Twenty-first Day of June, 1994

Attest:

BRUCE LEHMAN

Attesting Officer     Commissioner of Patents and Trademarks